United States Patent
Ashita

(10) Patent No.: US 8,446,980 B2
(45) Date of Patent: May 21, 2013

(54) DISTORTION COMPENSATION CIRCUIT AND A DISTORTION COMPENSATION METHOD

(75) Inventor: Junya Ashita, Tokyo (JP)

(73) Assignee: NEC Corporation, Tokyo (JP)

( * ) Notice: Subject to any disclaimer, the term of this patent is extended or adjusted under 35 U.S.C. 154(b) by 283 days.

(21) Appl. No.: 12/991,393

(22) PCT Filed: May 22, 2009

(86) PCT No.: PCT/JP2009/059830
§ 371 (c)(1),
(2), (4) Date: Nov. 5, 2010

(87) PCT Pub. No.: WO2009/145283
PCT Pub. Date: Dec. 3, 2009

(65) Prior Publication Data
US 2011/0064155 A1 Mar. 17, 2011

(30) Foreign Application Priority Data
May 28, 2008 (JP) .................. 2008-138817

(51) Int. Cl.
*H04K 1/02* (2006.01)
(52) U.S. Cl.
USPC .......................................... 375/297; 375/296
(58) Field of Classification Search
USPC .................................. 375/297, 296
See application file for complete search history.

(56) References Cited

U.S. PATENT DOCUMENTS

| | | | | |
|---|---|---|---|---|
| 6,078,216 A * | 6/2000 | Proctor, Jr. | ..................... | 330/151 |
| 6,531,917 B2 * | 3/2003 | Yamamoto et al. | ............ | 330/149 |
| 6,677,820 B2 * | 1/2004 | Miyatani | ........................ | 330/149 |
| 6,859,099 B2 * | 2/2005 | Akaiwa | ............................ | 330/149 |
| 7,197,286 B2 * | 3/2007 | Ode et al. | .................... | 455/114.3 |
| 7,496,334 B2 * | 2/2009 | Saito | ............................ | 455/114.3 |
| 2002/0191710 A1 * | 12/2002 | Jeckeln et al. | ................ | 375/296 |
| 2003/0118125 A1 * | 6/2003 | Doi | ................................ | 375/297 |
| 2005/0079834 A1 * | 4/2005 | Maniwa et al. | ............. | 455/114.3 |
| 2005/0101258 A1 * | 5/2005 | Kubo et al. | ................. | 455/67.13 |

FOREIGN PATENT DOCUMENTS

| | | |
|---|---|---|
| JP | 61-146004 A | 7/1986 |
| JP | 10-150393 A | 6/1998 |
| JP | 2001251148 A | 9/2001 |
| JP | 2002223171 A | 8/2002 |
| JP | 2003168931 A | 6/2003 |
| JP | 2004064711 A | 2/2004 |

OTHER PUBLICATIONS

International Search Report for PCT/JP2009/059830 mailed Jul. 28, 2009.

* cited by examiner

*Primary Examiner* — Juan A Torres

(57) ABSTRACT

A distortion compensation circuit is provided with an input level limitation unit that limits signal level of an input signal and outputs a signal before distortion compensation, a distortion compensation unit that performs distortion compensation processing to the signal before distortion compensation and outputs a signal after distortion compensation, an distortion compensation coefficient calculation unit that calculates a coefficient for compensating distortion of the output signal of an amplifier as a distortion compensation coefficient, a storage unit that stores the distortion compensation coefficient and a limit value calculation unit that calculates signal level of the signal before distortion compensation.

20 Claims, 8 Drawing Sheets

DISTORTION COMPENSATION CIRCUIT AND A DISTORTION COMPENSATION METHOD

CROSS REFERENCE TO RELATED APPLICATIONS

This application claims priority based on Japanese Patent Application No. 2008-138817 filed on May 28, 2008 and the disclosure thereof is incorporated herein in its entirety.

TECHNICAL FIELD

The present invention relates to a distortion compensation circuit and a distortion compensation method and, in particular, relates to a distortion compensation circuit and a distortion compensation method for outputting a signal with predetermined compensation applied to an amplifier so that distortion does not occur to the output signal of the amplifier.

BACKGROUND ART

In a digital wireless communication system of recent years, multiplexing by a CDMA (Code Division Multiple Access) method or modulation by an OFDM (Orthogonal Frequency Division Multiplexing) method is used. A multiple modulated wave generated in some sort of communication systems such as a communication system using a CDMA method or an OFDM method has a characteristic to include a wave with instantaneous electric power much larger than average electric power. Therefore, a power amplifier for transmission of the above-mentioned communication systems needs to maintain linearity up to very high output level. This is because, suppressing the spread of a transmission spectrum caused by nonlinear distortion reduces adjacent channel leakage power. Further, instantaneous electric power is expressed using a peak factor or a crest factor and so on.

However, there is a problem that a power amplifier having good linearity up to very high output level, that is, up to a large amplitude component, has a large circuit scale, is expensive, and also has large power consumption. Therefore, a power amplifier having good linearity in a small amplitude component, but having nonlinearity in a large amplitude component is generally well used. For a power amplifier having such nonlinearity, by making an output back-off as small as possible, further efficiency improvement can be implemented. The back-off is to lower average electric power to prevent saturation and so on. However, when the back-off is decreased, because an input signal tends to enter a nonlinearity region of an amplifier, adjacent channel leakage power which is a distortion component of a wireless transmission signal is apt to become large.

In order to suppress adjacent channel leakage power caused by nonlinear distortion of a power amplifier, various distortion compensation technologies are proposed. Among them, as a distortion compensation technology adopted most often in recent years, there is a digital pre-distortion method.

FIG. 5 is a block diagram showing an exemplary structure of a wireless transmitter including a distortion compensation circuit of a digital pre-distortion method. A wireless transmitter of FIG. 5 includes transmission data generation unit 21, D/A converter (Digital-Analog Converter. Hereinafter called as "DAC") 22A and 22B, quadrature modulator 23, reference signal generator unit 24, power amplifier 25 and distortion compensation circuit 20. Distortion compensation circuit 20 includes nonlinear distortion compensation operation unit 4, directional coupler 26, quadrature demodulator 27 and A/D converter (Analog-Digital Converter. Hereinafter called as "ADC") 28A and 28B, distortion compensation coefficient update unit 5A and electric power computation unit 8.

The nonlinear distortion compensation operation unit 4 performs distortion compensation operation for digital quadrature baseband signals I and Q from transmission data generation unit 21 by complex multiplication based on distortion compensation coefficients K and θ calculated in advance. Quadrature baseband signals I" and Q" after distortion compensation operation is performed, are converted by the DACs 22A and 22B into analog signals and become analog quadrature baseband signals. And the quadrature modulator 23 converts analog quadrature baseband signals into quadrature modulation signals using a signal from the reference signal generator unit 24. Quadrature modulation signals are power amplified by the power amplifier 25, and outputted as an RF (Radio Frequency) signal.

Part of the RF signals are fed back to the quadrature demodulator 27 via the directional coupler 26, and are demodulated to analog quadrature baseband signals using a signal from the reference signal generator unit 24. Analog quadrature baseband signals are converted by the ADCs 28A and 28B into digital signals and become feedback quadrature baseband signals Ib and Qb.

The distortion compensation coefficient update unit 5A compares feedback quadrature baseband signals Ib and Qb and quadrature baseband input signals I and Q from the transmission data generation unit 21 and calculates a distortion compensation coefficient. The distortion compensation coefficient update unit 5A updates the distortion compensation coefficient to the latest value and stores it. At this time, the distortion compensation coefficient update unit 5A stores the distortion compensation coefficient by correlating it to electric power of quadrature baseband signals I and Q. Electric power of quadrature baseband signals I and Q is calculated by the electric power computation unit 8.

The nonlinear distortion compensation operation unit 4 reads the distortion compensation coefficient correlated to electric power of quadrature baseband signals I and Q and performs distortion compensation using the read distortion compensation coefficient. By the above mentioned signal processing, adaptive distortion compensation is implemented.

The circuit configuration of a distortion compensation circuit of a digital pre-distortion method described above is one example. A circuit configuration which adopts digital method for quadrature modulation and quadrature demodulation or a circuit configuration using a frequency converter instead of direct modulation is also proposed. Also, a circuit configuration which performs distortion compensation operation using a distortion compensation coefficient correlated to amplitude instead of a distortion compensation coefficient correlated to electric power is also proposed. Further, amplitude is proportional to a square root of electric power. Accordingly, by setting up amplitude computation unit which computes amplitude, amplitude can be obtained based on electric power.

An example of an input/output characteristic of a wireless transmitter including a distortion compensation circuit of the digital pre-distortion method mentioned above is shown in FIG. 6. FIG. 6 indicates input/output characteristics of the nonlinear distortion compensation operation unit 4, the power amplifier 25 and an entire wireless transmitter respectively per input level normalized by setting saturated input level of the power amplifier 25 as 1. It can be found that, by giving an inverse characteristic of the input/output characteristic of the power amplifier 25 having nonlinearity in the nonlinear distortion compensation operation unit 4, a linear input/output characteristic is obtained for the entire wireless transmitter.

However, as the input/output characteristic of the nonlinear distortion compensation operation unit 4 indicates, when distortion compensation is made, at an input level of about 0.5-0.6, which is about 4 dB-6 dB lower than 1 which is saturated input level, signal level after distortion compensation operation reaches a saturated point of the power amplifier 25. In case of no compensation, a phenomenon such as a range of input level which can be inputted without making the power amplifier 25 being saturated is limited to a range with a minimum below the saturated input level does not occur normally.

And an amount for which input level is limited against saturated input level is equal to a decreased amount of an actual gain against a linear gain of a saturated output point. In other words, a limited amount of input level and a decreased amount of linear gain are equal. This means that, for a distortion compensation circuit of a digital pre-distortion method of FIG. 5, a relation of output back-off=input back-off holds. As mentioned above, for the distortion compensation circuit of a digital pre-distortion method of FIG. 5, in order to avoid the generation of clipping distortion in a saturated region of an amplifier, input level needs to be limited. Further, although occurrence of clipping distortion can be prevented by limiting input level, a distortion compensation circuit of a pre-distortion method cannot compensate clipping distortion which occurred once.

The limitations mentioned above relating to a distortion compensation circuit of a pre-distortion method also apply similarly to an instantaneous input. That is, by performing distortion compensation, an output of a power amplifier reaches a saturated region for instantaneous input level also, which is several dB lower than saturated input level of in case of no compensation. Therefore, there is a problem that clipping distortion increases and distortion compensation effect declines.

Further, "clipping distortion" is a ratio of leakage power at frequency deviated for certain frequency from center frequency, which is generated when a signal is inputted to an amplifier with an ideal amplifier characteristic having an ideal limiter characteristic, against electric power at center frequency. Further, "ideal limiter characteristic" is a characteristic by which an amplitude-amplitude characteristic (hereinafter called as "AM (Amplitude Modification)/AM characteristic") is linear up to a saturated point. "Ideal amplifier characteristic" is a characteristic which has "ideal limiter characteristic" and whose amplitude-phase characteristic (hereinafter called as "AM/PM (Phase Modification) characteristic" is flat.

Thus, distortion compensation by a digital pre-distortion method compensates only nonlinear distortion of AM/AM characteristics and AM/PM characteristics generated by a power amplifier. Distortion compensation by a digital pre-distortion method cannot compensate clipping distortion in a saturated region. As mentioned above, a multiplex modulated wave which is generated in a communication system using a CDMA method or in a communication system using OFDM modulation and so on includes a wave with instantaneous power whose amplitude is very large against average electric power. Accordingly, as clipping distortion is apt to occur, it is important to limit instantaneous maximum electric power of an input signal not to exceed the saturated electric power of a power amplifier for transmission.

Further, distortion compensation equipment by a pre-distortion method is disclosed, for example, in Japanese Patent Application Laid-Open No. 2002-223171. A method to suppress amplitude adaptively is disclosed, for example, in Japanese Patent Application Laid-Open No. 2004-064711.

A distortion compensation circuit for suppressing very large instantaneous amplitude which occurs on an envelope, and which becomes a factor of the above-mentioned problem, is disclosed in Japanese Patent Application Laid-Open No. 2001-251148 (hereinafter referred to as "patent document 1") and Japanese Patent Application Laid-Open No. 2003-168931 (hereinafter referred to as "patent document 2").

In the distortion compensation circuit disclosed in patent document 1, the problem mentioned above is resolved by setting limitation to a distortion compensation coefficient calculated in the distortion compensation coefficient update unit 5A of FIG. 5. FIG. 7 is a block diagram showing an exemplary structure of a distortion compensation coefficient update unit disclosed in patent document 1.

As shown in FIG. 7, the distortion compensation coefficient update unit 5B includes distortion compensation coefficient data memory 7, distortion compensation coefficient calculation unit 6, limit value setting unit 16, distortion compensation coefficient correction portion 12 and coefficient limitation determination unit 13. Further, in FIG. 7, an identical code is attached to a component identical to a component shown in FIG. 5. Also, in FIG. 7, part of the names of components in the drawings disclosed in patent document 1 are modified or simplified.

The distortion compensation coefficient calculation unit 6 compares quadrature baseband signals I and Q with feedback quadrature baseband signal Ib and Qb on the polar coordinates, calculates an amplitude difference and a phase difference, and calculates distortion compensation coefficient h based on them. The coefficient limitation determination unit 13 computes, using distortion compensation coefficient h calculated in the distortion compensation coefficient calculation unit 6, electric power x of a signal after distortion compensation operation to inputted quadrature baseband signals I and Q is performed. By comparing electric power x and upper limit electric power Pmax set to the limit value setting unit 16 in advance, it is judged whether limitation is given to a distortion compensation coefficient. And determination result and calculated electric power x after distortion compensation operation are outputted to the distortion compensation coefficient correction unit 12.

In case electric power x after distortion compensation operation is no more than upper limit electric power Pmax, limitation is not given to distortion compensation coefficient h. In this case, the distortion compensation coefficient correction unit 12 outputs distortion compensation coefficient h calculated in the distortion compensation coefficient calculation unit 6 to the distortion compensation coefficient data memory 7 just as it is.

On the other hand, when electric power x after distortion compensation operation exceeds upper limit electric power Pmax, limitation is given to distortion compensation coefficient h. In this case, the distortion compensation coefficient correction unit 12, after making a correction that distortion compensation coefficient h calculated in the distortion compensation coefficient calculation unit 6 becomes 1/m times as much, outputs it to the distortion compensation coefficient data memory 7. Here, m is an amplitude limitation coefficient, and is calculated using the following formula:

$$m=(x/P\mathrm{max})^{1/2}.$$

The distortion compensation coefficient data memory 7 stores the distortion compensation coefficient h by correlating it to electric power of quadrature baseband signals I and Q from the electric power computation unit 8.

Here, by using a distortion compensation circuit including the distortion compensation coefficient update unit 5B as shown in FIG. 7, it is possible to correct the size of an amplitude compensation coefficient while to maintaining the phase to an input signal, and to limit signal amplitude after distortion compensation operation.

In the technology described in patent document 1, because limitation is being made to the amplitude compensation coefficient itself, amplitude of feedback quadrature baseband signals Ib and Qb from the power amplifier 25 (refer to FIG. 5) is limited. However, amplitude of quadrature baseband signals I and Q is not limited. That is, in the distortion compensation coefficient calculation unit 6, a distortion compensation coefficient is calculated by comparison operation between quadrature baseband input signals I and Q for which amplitude is not limited and feedback quadrature baseband signals Ib and Qb for which amplitude is limited. Therefore, an amplitude difference and a phase difference between feedback quadrature baseband signals Ib and Qb, and I and Q cannot be obtained correctly. Accordingly, there is a problem that highly precise distortion compensation cannot be implemented.

As a method of resolution for this problem, there is a method disclosed in patent document 2. The method of patent document 2 utilizes the fact that, when input amplitude does not exceed the distortion compensable upper limit input amplitude (in an example of FIG. 6, about 0.5-0.6) of the nonlinear distortion compensation operation unit 4, amplitude after distortion compensation operation does not exceed saturated input amplitude of a power amplifier. In other words, the method disclosed in patent document 2 is a method to limit a maximum value of amplitude based on the relation of output back-off=input back-off. That is, in a preceding step of a circuit in which distortion compensation operation is made, a maximum value of amplitude is limited to the level in which input amplitude will be the amplitude where output back-off is added to an effective value.

FIG. 8 is a block diagram showing one exemplary structure of a wireless transmitter described in patent document 2. Further, in FIG. 8, an identical code is attached to a component identical to the component shown in FIG. 5. Distortion compensation circuit 30 of FIG. 8 includes electric power computation unit 1, coefficient calculation unit 14, limit value setting unit 15 and amplitude limitation unit 3 in the receding step of the nonlinear distortion compensation operation unit 4, and other components are same as FIG. 5. Further, in FIG. 8, part of the names of components in the drawings disclosed in patent document 2 are simplified or modified.

The electric power computation unit 1 computes electric power P of quadrature baseband signals I and Q and outputs electric power P to the coefficient calculation unit 14. The coefficient calculation unit 14 compares electric power P and electric power limit value Pth set to the limit value setting unit 15 in advance. The coefficient calculation unit 14 decides not to perform amplitude limitation in case the electric power P is no more than electric power limit value Pth, and outputs 1 as a multiplier coefficient. On the other hand, in case the electric power P is larger than the electric power limit value Pth, the coefficient calculation unit 14 decides to perform amplitude limitation, and output $(Pth/P)^{1/2}$ as a multiplier coefficient. Further, a multiplier coefficient when amplitude limitation is performed is not limited to this value, and any value such that electric power value P of quadrature baseband signals I and Q become not more than limit value Pth will do.

The amplitude limitation unit 3 performs amplitude limitation by "circular clipping" by multiplying a multiplier coefficient from the coefficient calculation unit 14 to each of an I component and a Q component of a quadrature baseband signal from transmission data generation unit 21. The "circular clipping" is a clipping where the amplitude which is a result of an I component and a Q component being synthesized is limited to no more than a fixed size for all phases. The nonlinear distortion compensation operation unit 4 performs distortion compensation by complex multiplication based on a distortion compensation coefficient, to quadrature baseband signals I' and Q' after amplitude limitation for the signals is performed. An updating method of a distortion compensation coefficient and a referring method of a distortion compensation coefficient are similar to an example mentioned above.

Thus, in the distortion compensation circuit described in patent document 2, nonlinear distortion compensation is performed, by a circular clipping on the orthogonal coordinates, after performing amplitude limitation of a quadrature baseband transmission signal. Accordingly, the distortion compensation circuit described in patent document 2 will not err in operations to obtain an amplitude difference and a phase difference, suppress clipping distortion component and can improve the later nonlinear distortion compensation effect substantially.

DISCLOSURE OF THE INVENTION

Technical Problem

However, the above-mentioned technologies include the following problems respectively. In the technology described in patent document 2, when a characteristic of the power amplifier 25 is always constant, a problem about distortion compensation will not occur. However, perfect distortion compensation operation is not guaranteed case saturated output level of the power amplifier 25 declines by aged deterioration or temperature change (output back-off declines) or in case a breakdown of the power amplifier 25 occurs.

For example, when saturated output level of the power amplifier 25 declines, the distortion compensable upper limit input level of the nonlinear distortion compensation operation unit 4 shown in FIG. 6 also declines. At this time, as electric power limit value Pth of the limit value setting unit 15 is not changed, signal level after amplitude limitation exceeds the distortion compensable upper limit input level of the nonlinear distortion compensation operation unit 4. And because no limitation is made to amplitude for a signal after distortion compensation operation, clipping distortion is generated. Also, when saturated output level of the power amplifier 25 further declines, and a distortion compensation coefficient has diverged, there is a risk that very large signal amplitude is inputted to a power amplifier, and the power amplifier may break down.

As stated above, in order to perform perfect distortion compensation, amplitude limitation to a quadrature baseband signal by the technology described in patent document 2 only is not sufficient. Accordingly, because parallel use with a technology which applies limitation to signal level after distortion compensation or to a distortion compensation coefficient itself, for example, the technology described in patent document 1, is needed, after all, a problem which cannot calculate a highly precise distortion compensation coefficient is not resolved.

The present invention is made in view of a problem of the above-mentioned related technologies, and the object is to provide a distortion compensation circuit and a distortion compensation method which limit signal level of a signal after distortion compensation, and improve distortion compensation effect.

Technical Solution

A distortion compensation circuit of this invention includes: an input level limitation unit that limits signal level of an input signal from outside to no more than a first limit value, and outputs a signal before distortion compensation; a distortion compensation. unit that performs distortion compensation processing to the signal before distortion compensation based on a distortion compensation coefficient, and outputs a signal after the distortion compensation; a distortion compensation coefficient calculation unit that calculates a coefficient for compensating distortion of an output signal of an amplifier as a distortion compensation coefficient based on a difference between part of output signals of the amplifier which amplified the signal after distortion compensation and the signal before distortion compensation; a storage unit that stores the distortion compensation coefficient by correlating it to signal level of the signal before the distortion compensation, and a limit value calculation unit that calculates signal level of the signal before distortion compensation as the first limit value providing the signal level after the distortion compensation processing based on the distortion compensation coefficient stored in the storage unit is no more than a second limit value which is a limit value of signal level of an input signal to the amplifier.

A distortion compensation circuit of this invention includes: a coefficient calculation unit that judges whether to limit signal level of the transmission signal by comparing signal level of a transmission signal inputted from outside and a first limit value, and when decided to limit signal level of the transmission signal, outputs a coefficient which limits signal level of the transmission signal to no more than the first limit value; a signal level limitation unit that limits signal level of the transmission signal by multiplying the coefficient to the transmission signal; a distortion compensation coefficient calculation unit that obtains a difference between a signal before compensation which is an output signal of the signal level limitation unit and a feedback signal which fed back part of output signals of an amplifier which amplified a signal after distortion compensation which is a signal such that distortion compensation processing is performed to a signal before compensation, and calculates an amplitude compensation coefficient and a phase compensation coefficient; a storage unit that stores the amplitude compensation coefficient and the phase compensation coefficient by correlating them to electric power or amplitude of the signal before compensation: a distortion compensation operation unit that performs the distortion compensation processing to the signal before compensation based on the amplitude compensation coefficient and a phase compensation coefficient, and outputs the signal after distortion compensation, and a limit value calculation unit that calculates signal level of the signal before distortion compensation as the first limit value providing the signal level after the distortion compensation processing based on the amplitude compensation coefficient and the phase compensation coefficient stored in the storage unit is no more than a second limit value which is a limit value of signal level of an input signal to an amplifier.

A distortion compensation method of this invention includes: limiting signal level of an input signal from outside to no more than a first limit value, and outputting a signal before distortion compensation: based on a distortion compensation coefficient, performing distortion compensation processing to the signal before distortion compensation, and outputting a signal after distortion compensation; based on a difference between part of output signals of an amplifier which amplified the signal after distortion compensation and the signal before distortion compensation, calculating a coefficient for compensating distortion of an output signal of the amplifier as the distortion compensation coefficient; storing the distortion compensation coefficient by correlating it to signal level of the signal before distortion compensation, and calculating signal level of the signal before distortion compensation as the first limit value providing the signal level after the distortion compensation processing based on the distortion compensation coefficient stored in the storage unit is no more than a second limit value which is a limit value of signal level of an input signal to the amplifier.

Advantageous Effect of the Invention

A distortion compensation circuit and a distortion compensation method of the present invention have the effect to improve the distortion compensation effect.

BRIEF DESCRIPTION OF THE DRAWINGS

BEST MODE FOR CARRYING OUT THE INVENTION (The First Exemplary Embodiment)
The first exemplary embodiment of the present invention will be described with reference to drawings. FIG. 1 is a schematic block diagram of a distortion compensation circuit of the first exemplary embodiment of the present invention. This exemplary embodiment indicates a principle of the present invention in order to help understanding of the present invention.

Figure 1:
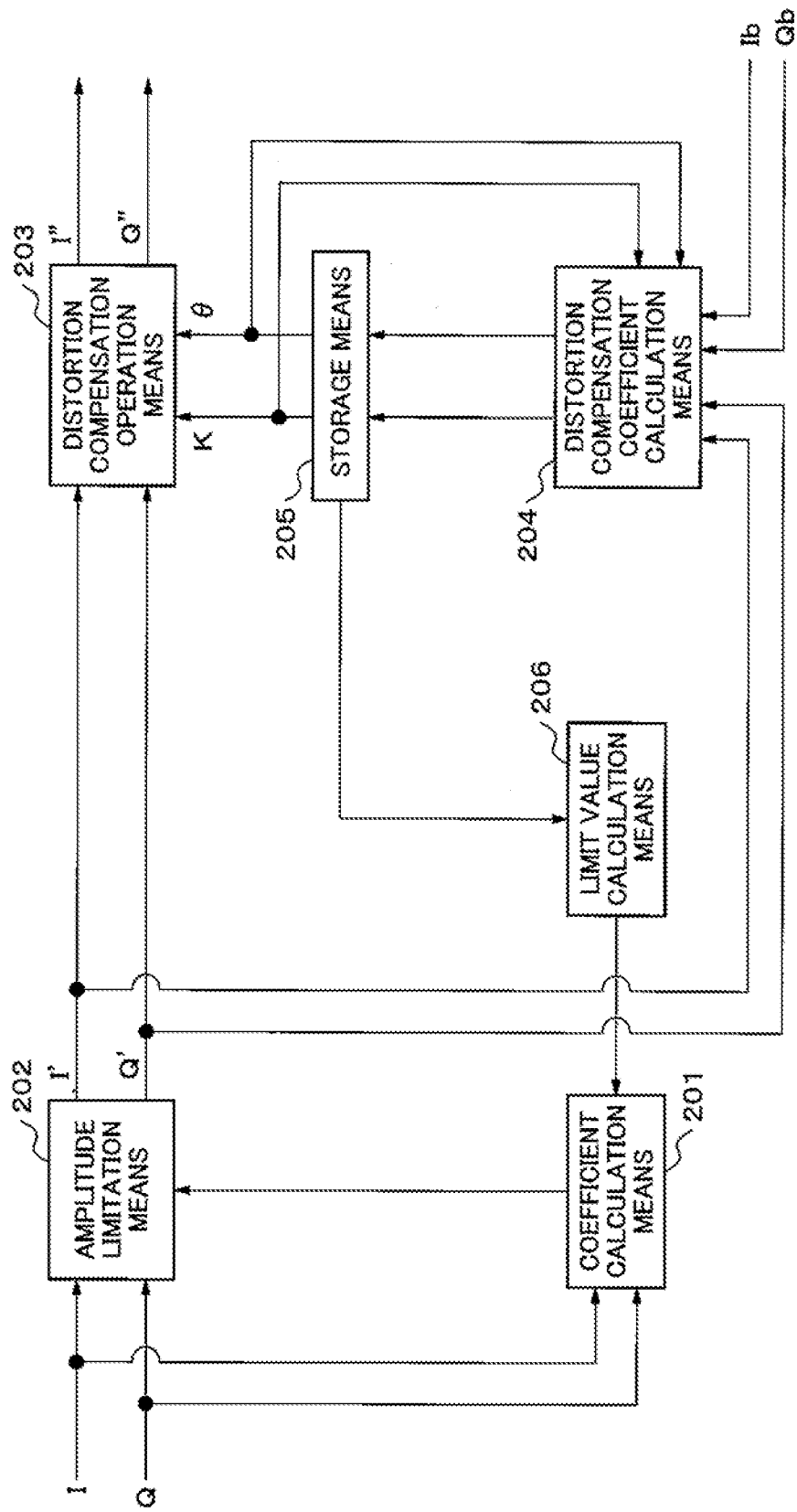
FIG. 1 is a schematic block diagram of a distortion compensation circuit of the first embodiment of the present invention.

A distortion compensation circuit shown in FIG. 1 is a distortion compensation circuit which, in order to suppress occurrence of distortion in an amplifier which amplifies quadrature baseband transmission signals I and Q, performs a predetermined compensation processing to quadrature baseband transmission signals I and Q. This distortion compensation circuit includes coefficient calculation means 201, amplitude limitation means 202, distortion compensation operation means 203, distortion compensation coefficient calculation means 204, storage means 205 and limit value calculation means 206.

The coefficient calculation means 201 judges whether to perform amplitude limitation of quadrature baseband transmission signals I and Q by comparing electric power value of quadrature baseband transmission signals I and Q and electric power limit value before compensation which will be described later. And the coefficient calculation means 201, when decided to perform amplitude limitation, outputs a coefficient for making electric power of quadrature baseband transmission signals I and Q not being more than an electric power limit value before compensation as a multiplier coefficient.

The amplitude limitation means 202 performs amplitude limitation by multiplying a multiplier coefficient from the coefficient calculation means 201 to quadrature baseband transmission signals I and Q.

The distortion compensation coefficient calculation means 204 obtains an amplitude difference and a phase difference between output signals I' and Q' of the amplitude limitation means 202 and feedback quadrature baseband signals Ib and Qb which are part of output signals of an amplifier fed back, and calculates amplitude compensation coefficient K and phase compensation coefficient θ.

A distortion compensation coefficient can be obtained, for example, by adaptive signal processing using LMS (Least Mean Square) algorithm disclosed in patent document 1. That is, by comparing a signal before distortion compensation and a signal after distortion compensation amplified by an amplifier, amplitude compensation coefficient K and phase compensation coefficient θ are calculated so that the difference between the compared signals will be zero. Signals before distortion compensation correspond to output signals I' and Q' of the amplitude limitation means 202, and signals after distortion compensation amplified by an amplifier correspond to feedback quadrature baseband signals Ib and Qb. Further, a calculation method of a distortion compensation coefficient is not limited to a method using LMS algorithm. In short, a calculation method of a distortion compensation coefficient can be a method that calculates a distortion compensation coefficient to minimize the difference between a signal before distortion compensation and a signal after distortion compensation amplified by an amplifier.

The storage means 205, by correlating it with electric power or amplitude of output signals I' and Q' of the amplitude limitation means 202, stores amplitude compensation coefficient K and phase compensation coefficient θ. For example, a value of electric power or amplitude of output signals I' and Q' are made an address of a storage area set up in storage means 205. And as data, amplitude compensation coefficient K and phase compensation coefficient θ corresponding to output signals I' and Q' are stored at the address of the storage area.

The distortion compensation operation means 203 performs distortion compensation to output signals I' and Q' of the amplitude limitation means 202 based on amplitude compensation coefficient K and phase compensation coefficient θ.

The limit value calculation means 206 refers to stored contents of the storage means 205, and obtains electric power in case distortion compensation operation to output signals I' and Q' is performed by the distortion compensation operation means 203. And electric power of output signals I' and Q' when the electric power becomes nearly equal to an electric power limit value after compensation, is calculated as the electric power limit value before compensation mentioned above.

In other words, electric power of a signal after distortion compensation operation when distortion compensation operation is performed to output signals I' and Q' which are signals before distortion compensation operation, is obtained. At this time, output signals I" and Q" are not outputted from the distortion compensation operation means 203 actually, but in every respect, electric power of a signal after distortion compensation operation when it is assumed that distortion compensation operation by the distortion compensation operation means 203 is performed, is obtained. And electric power of output signals I' and Q' for which electric power of a signal after distortion compensation operation becomes nearly equal to an electric power limit value after compensation, is set as an electric power limit value before compensation. Accordingly, an electric power limit value before compensation is the limit value for limiting electric power of output signals I' and Q' so that electric power of a signal after distortion compensation operation will be no more than the electric power limit value after compensation when distortion compensation operation is performed.

Thus, the limit value calculation means 206 calculates the first limit value for performing amplitude limitation in the coefficient calculation means 201 based on stored contents of the storage means 205. Accordingly, amplitude limitation to quadrature baseband transmission signals I and Q is performed adaptively, and amplitude of a signal after distortion compensation operation is limited to no more than the second limit value.

Further, the coefficient calculation means 201 may judge whether to perform amplitude limitation by comparing amplitude of quadrature baseband transmission signals I and Q with an amplitude limit value which is a limit value to amplitude instead of electric power of quadrature baseband IS transmission signals I and Q. When decided to limit amplitude, the coefficient calculation means 201 outputs a coefficient for making amplitude of quadrature baseband transmission signals I and Q not more than the amplitude limit value as a multiplier coefficient.

The limit value calculation means 206 refers to a distortion compensation coefficient stored in the storage means 205, and calculates amplitude of output signals I' and Q' such that amplitude when distortion compensation operation to output signals I' and Q' of the amplitude limitation means 202 is performed becomes nearly equal to the amplitude limit value after compensation as an amplitude limit value.

As stated above, in a distortion compensation circuit of the first exemplary embodiment, determination is made whether to limit amplitude of an input signal based on the electric power limit value or the amplitude limit value. The electric power limit value or the amplitude limit value is decided according to the signal level limit value after compensation. Therefore, electric power or amplitude of a signal after distortion compensation operation is limited to no more than the signal level limit value after compensation. Accordingly, because electric power or amplitude of a signal inputted to an amplifier is limited to no more than the predetermined limit value, there is an effect that can improve the effect of the distortion compensation.

(The Second Exemplary Embodiment)

Figure 2:
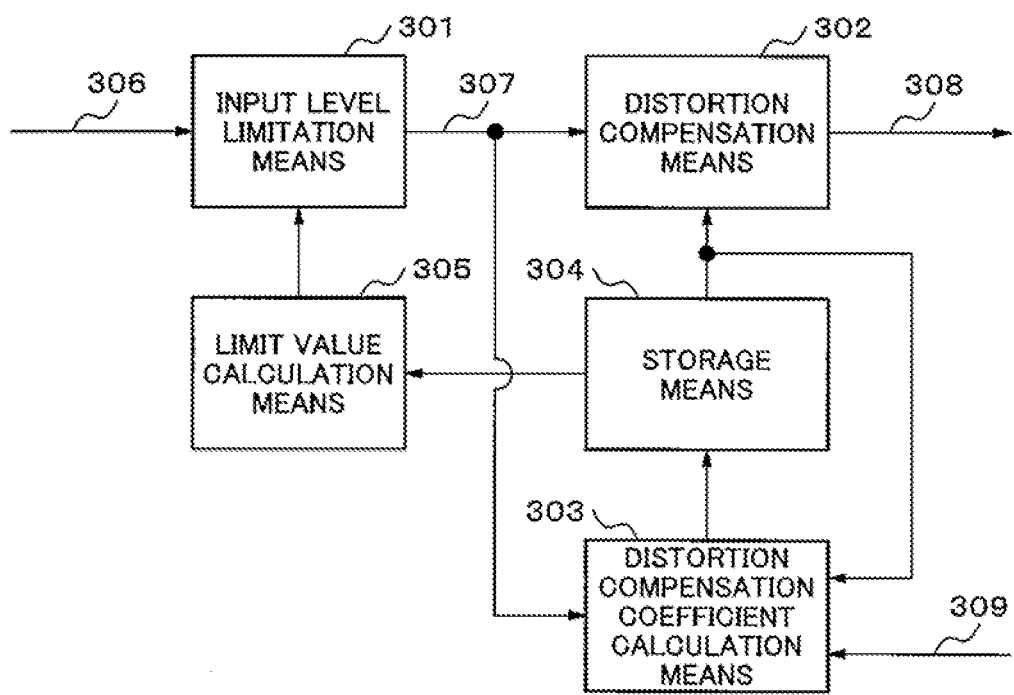
FIG. 2 is a block diagram showing a structure of a distortion compensation circuit of the second exemplary embodiment of the present invention.

Next, the second exemplary embodiment having an indispensable component only to put the present invention into effect will be described. FIG. 2 is a block diagram showing a structure of a distortion compensation circuit of the second exemplary embodiment of the present invention. As shown, a distortion compensation circuit of this exemplary embodiment is a distortion compensation circuit of the first exemplary embodiment with the coefficient calculation means 201 removed. Also, quadrature baseband transmission signals I and Q in the first exemplary embodiment are generalized to a normal signal of a single system.

A distortion compensation circuit of this exemplary embodiment performs predetermined distortion compensation processing to an output signal, that is, an input signal to an amplifier in advance, in order to suppress distortion which occurs to an output signal of an amplifier which amplifies a certain input signal. This distortion compensation method is the above-mentioned pre-distortion method.

This distortion compensation circuit includes input level limitation means 301, distortion compensation means 302, distortion compensation coefficient calculation means 303, storage means 304 and input level limit value calculation means 305.

The input level limitation means 301 is a generalized amplitude limitation means 202. The input level limitation means 301 limits input level of input signal 306, by a predetermined method, to no more than the input level limit value described later. For example, input level is limited by multiplying a predetermined coefficient to the input signal 306. Further, similar to the first exemplary embodiment, only when input level of the input signal 306 is no smaller than the input level limit value, input level may be limited.

Further, limitation to an input signal may not only be limitation to amplitude like the first exemplary embodiment but also be limitation to "signal level" in general. The "signal level" is an amount representing the size of a signal which is expressed by amplitude measured by volt or electric power measured by watt or dBm and so on.

The input level limitation means 301 limits signal level of the input signal 306 and inputs signal before distortion compensation 307 to the distortion compensation means 302. Conditions to limit signal level and a degree of limitation of the signal level will be described later.

The distortion compensation means 302 is a generalized distortion compensation operation means 203. The distortion compensation means 302 performs distortion compensation to the signal before distortion compensation 307 using a distortion compensation coefficient described later. An actual signal processing method for distortion compensation to be performed to the signal before distortion compensation 307 is not limited to multiplication of a distortion compensation coefficient to the signal before distortion compensation 307. For example, a table lookup method using a reference table which relates an input signal to a signal after distortion compensation and so on may be used. The distortion compensation means 302 outputs signal after distortion compensation 308 to an external amplifier (not illustrated). The external amplifier amplifies the signal after distortion compensation 308 and outputs an amplifier output signal.

The distortion compensation coefficient calculation means 303 performs similar operation to the distortion compensation coefficient calculation means 204. That is, the distortion compensation coefficient calculation means 303 obtains a difference between the signal before distortion compensation 307 and feedback signal 309 which is part of amplifier output signals fed back, and calculates a distortion compensation coefficient based on the difference. For example, differences are an amplitude difference or a phase difference.

The storage means 304 also performs similar operation to the storage means 205. That is, the storage means 304 stores a distortion compensation coefficient by correlating it to signal level of the signal before distortion compensation 307.

The input level limit value calculation means 305 is a generalized limit value calculation means 206. That is, the input level limit value calculation means 305 changes the input level limit value for limiting input level in the input level limitation means 301 based on a distortion compensation coefficient stored in storage means 304. The input level limit value calculation means 305 refers to a distortion compensation coefficient stored in the storage means 304 and obtains the signal level when the signal before distortion compensation 307 is assumed to be distortion compensated by the distortion compensation means 302. And in order that the signal level will be no more than the signal level limit value after compensation set to the signal after distortion compensation 308, a limit value of input level which should be applied to the input signal 306, that is, the input level limit value mentioned above will be obtained. The signal level limit value after compensation is, for example, signal level of the signal after distortion compensation 308 which will not make an output signal of an amplifier saturated.

Further, when the input level limit value calculation means 305 calculates an input level limit value, the signal after distortion compensation 308 is not outputted. In every respect, signal level of a signal after distortion compensation when signal before distortion compensation 307 is assumed to be distortion compensated, is obtained, and based on the signal level, a limit value of input level is obtained.

As stated above, in a distortion compensation circuit of the second exemplary embodiment determines whether to limit signal level of an input signal based on the input level limit value. The input level limit value is decided according to the signal level limit value after compensation. Therefore, signal level of a signal after distortion compensation is limited to no more than the signal level limit value after compensation. Accordingly, because signal level of a signal inputted to an amplifier is limited to no more than the signal level limit value after compensation, there are, for example, effects that no clipping distortion is generated in an output signal and distortion compensation effects can be improved.

(The Third Exemplary Embodiment)

Figure 3:
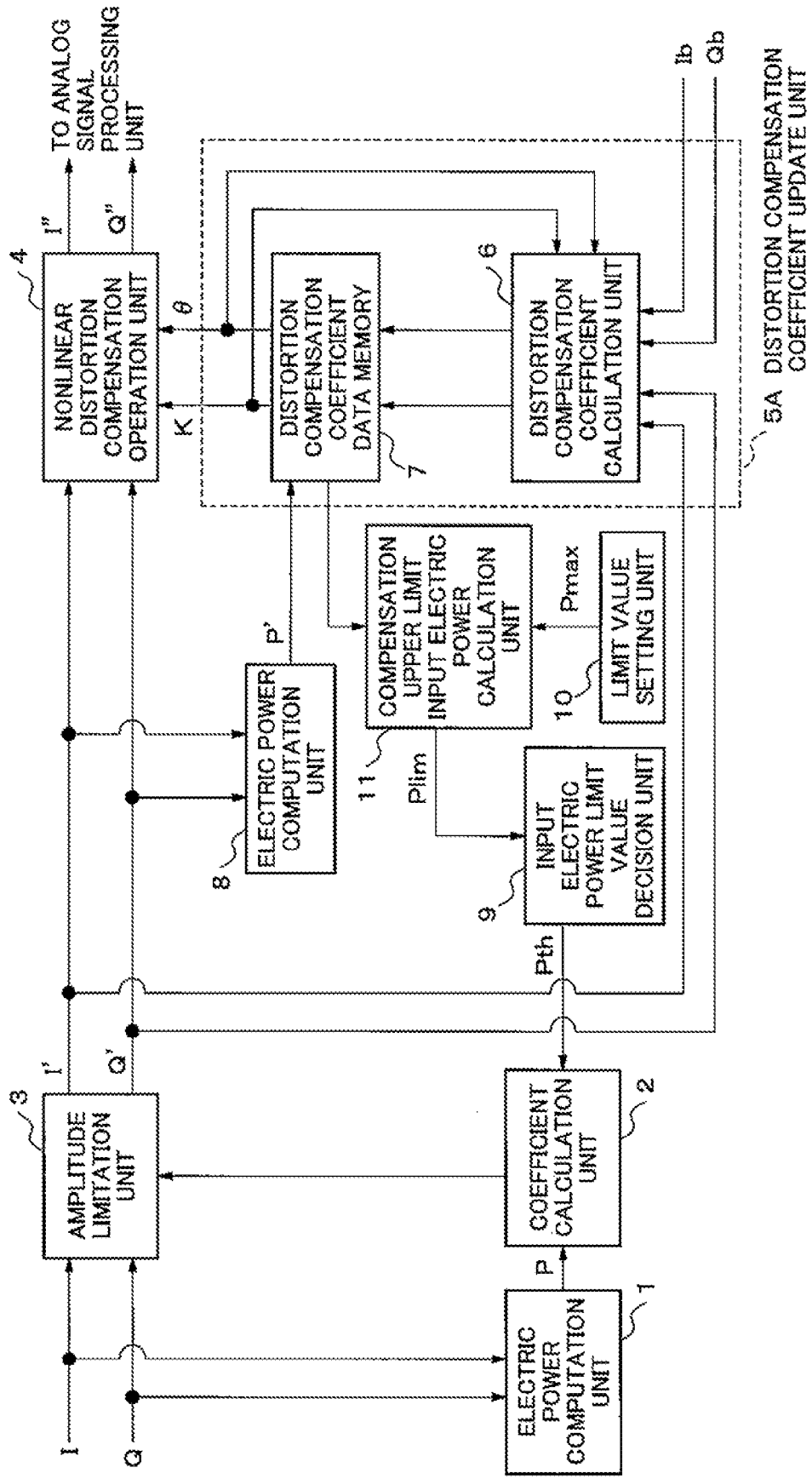
FIG. 3 is a block diagram showing a structure of a distortion compensation circuit of the third exemplary embodiment of the present invention.
Figure 5:
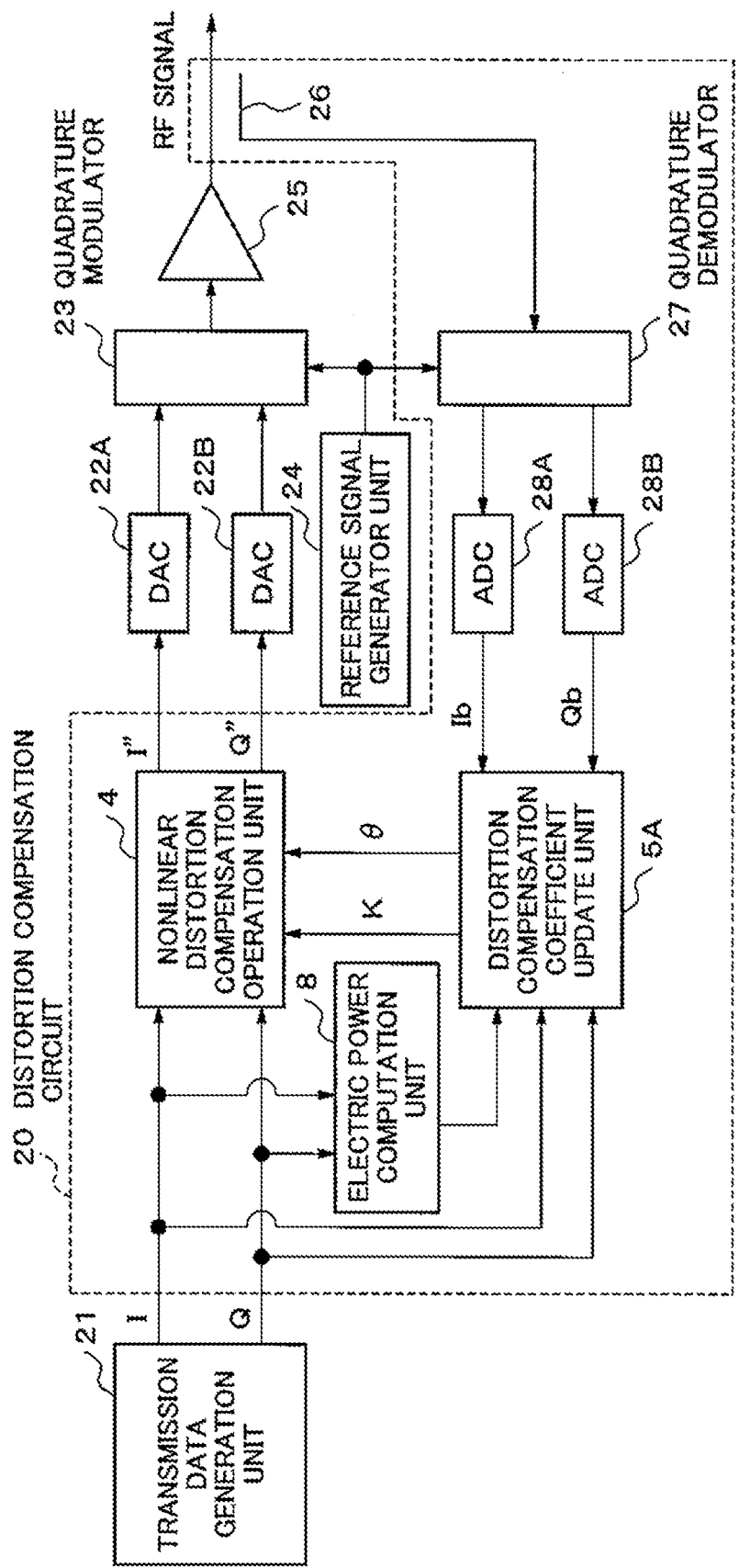
FIG. 5 is a block diagram showing an exemplary structure of a wireless transmitter including a distortion compensation circuit of a digital pre-distortion method.
Figure 6:
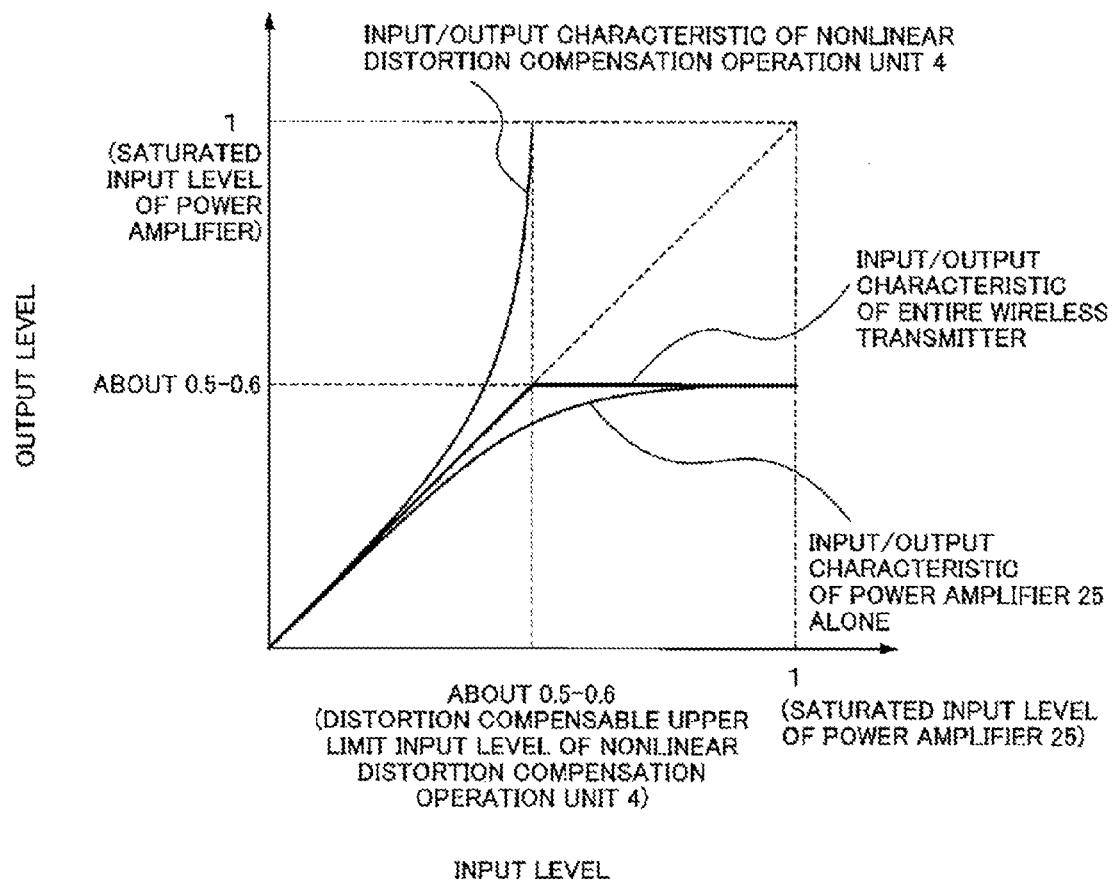
FIG. 6 is an explanatory drawing showing operation of a distortion compensation circuit of a digital pre-distortion method.
Figure 7:
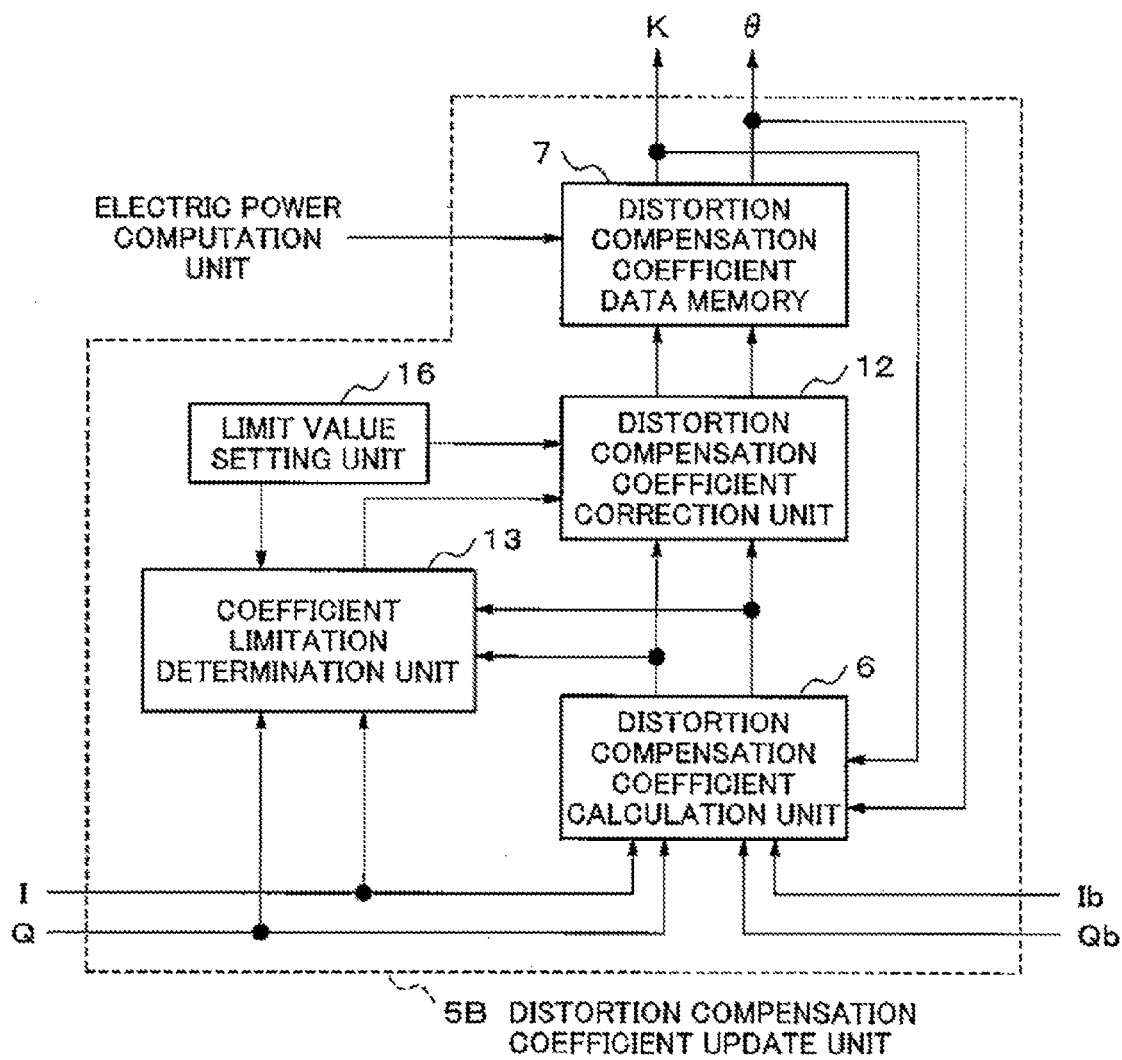
FIG. 7 is a block diagram showing an exemplary structure of the distortion compensation coefficient update unit described in patent document 1.
Figure 8:
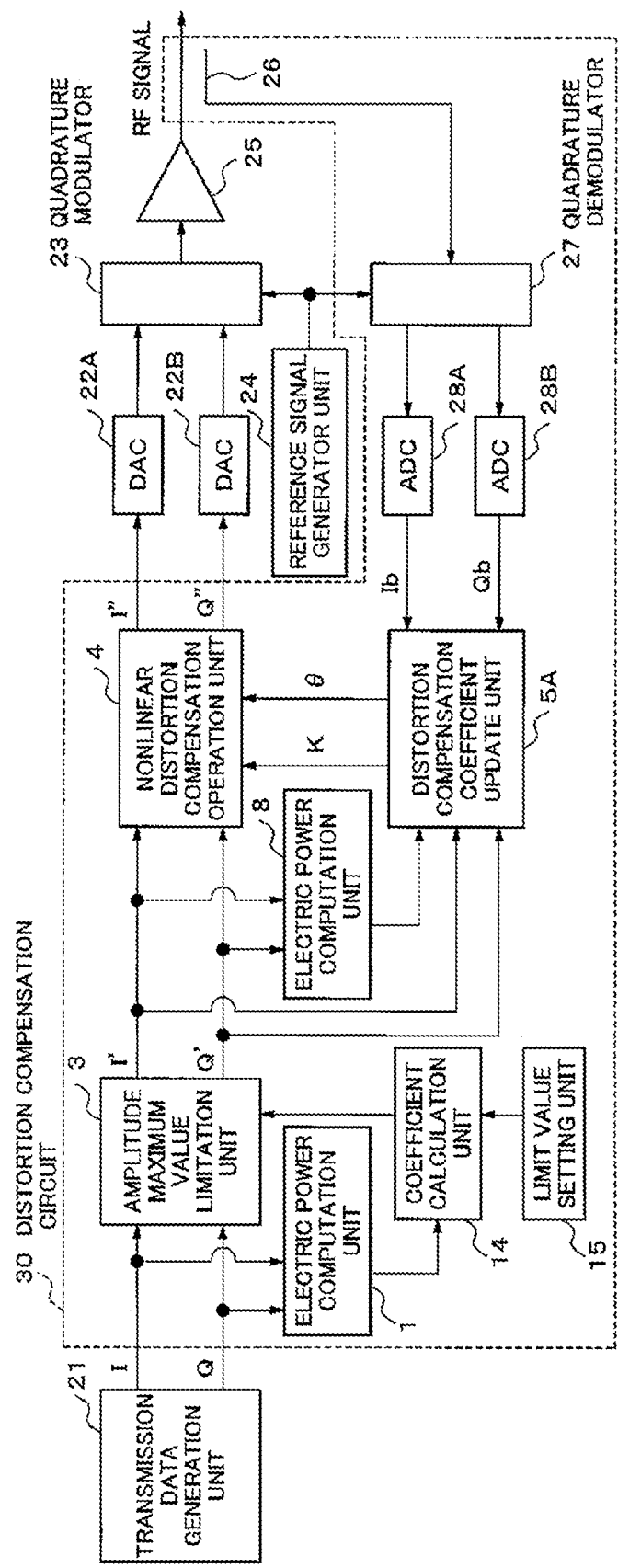
FIG. 8 is a block diagram showing an exemplary structure of the wireless transmitter described in patent document 2.

Hereinafter, the third exemplary embodiment of the present invention will be described with reference to drawings. FIG. 3 is a block diagram showing a structure of a distortion compensation circuit of the third exemplary embodiment of the present invention. For those components in FIG. 3 equal to those in FIG. 5 and FIG. 8, an identical code is attached. A distortion compensation circuit of this exemplary embodiment is used in a wireless transmitter such as a base station in a wireless communication system and is a distortion compensation circuit for compensating distortion that occurs in an amplifying means such as a power amplifier. This distortion compensation circuit includes electric power computation unit 1, coefficient calculation unit 2, amplitude limitation unit 3, nonlinear distortion compensation operation unit 4, distortion compensation coefficient update unit 5A, electric power computation unit 8, input electric power limit value decision unit 9, limit value setting unit 10 and compensation upper limit input electric power calculation unit 11. The distortion compensation coefficient update unit 5A includes distortion compensation coefficient calculation unit 6 and distortion compensation coefficient data memory 7.

The distortion compensation circuit of this exemplary embodiment limits amplitude based on the limit value decided adaptively to digital quadrature baseband signals I and Q. As an amplitude limitation method, for example, an amplitude limitation method by a circular clipping or an amplitude limitation method using a window function can be used.

In an amplitude limitation method by a circular clipping, electric power of quadrature baseband signals I and Q is calculated, and for a signal exceeding an electric power limit value, amplitude is limited while maintaining the phase of the signal. Although an amplitude limitation method by a circular clipping is a simple method, limitation processing is performed only for a part exceeding the limit value. Therefore, a discontinuity occurs in a processing result before and after the limitation point.

On the other hand, in an amplitude limitation method using a window function, when electric power x of quadrature baseband signals I and Q is larger than electric power limit value y, a window function for limiting electric power x to no more than electric power limit value y is generated. Window function is a function whose function value is 0 outside of a certain limited interval. And a window function having a fixed time interval is multiplied to a signal with electric power exceeding electric power limit value y and to a signal with electric power in the neighborhood of electric power limit value y. As a window function, well-known Hanning window or Kaisar window can be used. Although this processing is complicated, discontinuity will not occur. Either of the amplitude limitation methods mentioned above may be used. Below, a case will be described when an amplitude limitation method by a circular clipping is used.

The electric power computation unit 1 computes electric power P ($=I^2+Q^2$) of quadrature baseband signals I and Q and outputs it to the coefficient calculation unit 2. The coefficient calculation unit 2 compares electric power P from the electric power computation unit 1 and electric power limit value Pth given from the input electric power limit value decision unit 9. In case electric power P is no more than electric power limit value Pth, the coefficient calculation unit 2 decides not to perform amplitude limitation, and outputs I as a multiplier coefficient in order not to limit quadrature baseband signals I and Q. On the other hand, in case electric power P is larger than electric power limit value Pth, the coefficient calculation unit 2 decides to perform amplitude limitation and outputs $(Pth/P)^{1/2}$ as a multiplier coefficient. Further, a multiplier coefficient when amplitude limitation is performed is not limited to this value, and any value such that electric power P of quadrature baseband signals I and Q becomes not more than electric power limit value Pth will do.

The amplitude limitation unit 3 performs amplitude limitation by a circular clipping by multiplying a multiplier coefficient from the coefficient calculation unit 2 to each of an I component and a Q component of a quadrature baseband signal. The nonlinear distortion compensation operation unit 4 performs distortion compensation by complex multiplication based on distortion compensation coefficients K and θ from the distortion compensation coefficient update unit 5A to quadrature baseband signals I' and Q' after amplitude limitation is performed. And the nonlinear distortion compensation operation unit 4 outputs quadrature baseband signals I" and Q" after distortion compensation is performed, to an analog signal processing unit. An analog signal processing unit is, for example, a circuit including the DACs 22A and 22B, quadrature modulator 23 and power amplifier 25 in FIG. 5.

The distortion compensation coefficient calculation unit 6 compares quadrature baseband input signals I' and Q' with feedback quadrature baseband signal Ib and Qb on the polar coordinates and calculates an amplitude difference and a phase difference. And calculates distortion compensation coefficients K and θ based on the amplitude difference and the phase difference. The distortion compensation coefficient data memory 7 correlates distortion compensation coefficients K and θ calculated by the distortion compensation coefficient calculation unit 6 to electric power P' of quadrature baseband signal I' and Q' computed by the electric power computation unit 8, and stores them.

Further, feedback quadrature baseband signals Ib and Qb are generated based on a signal which is part of output signals of a power amplifier which is at the following step of a distortion compensation circuit fed back to the quadrature demodulator 27 via the directional coupler 26. A signal which is fed back to the quadrature demodulator 27 will be demodulated to an analog quadrature baseband signal by a signal from the reference signal generator unit 24, be converted into a digital signal afterward and become quadrature baseband signals Ib and Qb (refer to FIG. 5 and FIG. 8).

The electric power computation unit 8 computes electric power P' ($=I'^2+Q'^2$) of quadrature baseband signals I' and Q' for which amplitude limitation was performed and outputs it to the distortion compensation coefficient data memory 7. Further, instead of electric power P' of quadrature baseband signals I' and Q', amplitude proportional to square root of electric power P' may be used. In this case, the distortion compensation coefficient data memory 7 stores the distortion compensation coefficients K and θ by correlating them to amplitude.

The input electric power limit value decision unit 9 decides, by using distortion compensable upper limit input electric power Plim computed by the compensation upper limit input electric power calculation unit 11, and following the conditions below, electric power limit value Pth which gives an amplitude limitation maximum value of a quadrature baseband signal.

i) If Plim=Pth, leave electric power limit value Pth as it is.

ii) If Plim<Pth, change electric power limit value Pth to upper limit input electric power Plim.

iii) If Plim>Pth, change electric power limit value Pth to upper limit input electric power Plim.

The input electric power limit value decision unit 9 outputs decided electric power limit value Pth to the coefficient calculation unit 2. Also, by obtaining several electric power limit value Pth, their average may be taken and outputted to the coefficient calculation unit 2. That is, the input electric power limit value decision unit 9 may calculate reasonable number of electric power limit value Pth chronologically, store them, take average Pth (ave) of multiple calculated Pth, and output it to the coefficient calculation unit 2.

Upper limit electric power Pmax fixed in advance is set in the limit value setting unit 10. It is desirable that a value of upper limit electric power Pmax is set to input level which makes output of a power amplifier saturated, that is, a value equal to saturated input level.

Further, the upper limit electric power Pmax is not necessarily set to a value equal to saturated input level. For example, considering reduction in power consumption or elongation of a life cycle of a device and so on, the level inputted to an amplifier may be set lower than saturated input level. In such a case, a value of the upper limit electric power Pmax may be set to a value smaller than saturated input level.

The compensation upper limit input electric power calculation unit 11 refers to the distortion compensation coefficient data memory 7, and calculates input electric power Plim such that electric power of a quadrature baseband signal after distortion compensation operation becomes upper limit electric power Pmax (saturated input level) set by the limit value setting unit 10. In other words, if amplitude compensation coefficient K to input electric power Plim is α, then, calculate input electric power Plim for which the formula $$P\text{max}=\alpha \times P\text{lim}$$

holds. Input electric power Plim calculated in this way is distortion compensable upper limit input electric power. Because the distortion compensation coefficient data memory 7 stores a distortion compensation coefficient by correlating it to input electric power, α×Plim can be obtained easily. Accordingly, input electric power Plim such that α×Plim becomes equal to Pmax can also be obtained easily.

Next, operation of a distortion compensation circuit by the third embodiment of the present invention will be described with reference to FIG. 3. The coefficient calculation unit 2 judges whether to perform amplitude limitation by comparing electric power P of digital quadrature baseband signals I and Q calculated in the electric power computation unit 1 with electric power limit value Pth given from input electric power limit value decision unit 9. In case electric power P is no more than electric power limit value Pth, the coefficient calculation unit 2 decides not to perform amplitude limitation, and outputs 1 to the amplitude limitation unit 3 as a multiplier coefficient. On the other hand, in case electric power P is larger than electric power limit value Pth, the coefficient calculation unit 2 decides to perform amplitude limitation and outputs $(P\text{th}/P)^{1/2}$ to the amplitude limitation unit 3 as a multiplier coefficient.

The amplitude limitation unit 3 performs amplitude limitation by a circular clipping by multiplying a multiplier coefficient from the coefficient calculation unit 2 to each of an I component and a Q component of a quadrature baseband signal. Here, instead of a circular clipping, an amplitude limitation method using a window function may be applied. In this case, when electric power P is larger than electric power limit value Pth, the coefficient calculation unit 2 generates a window function convex cup with $(P\text{th}/P)^{1/2}$ as an apex. The amplitude limitation unit 3 multiplies the window function mentioned above having a fixed time interval to an electric power point which exceeds the limit value of quadrature baseband signals I and Q and an electric power point in the neighborhood.

Quadrature baseband signals I' and Q' for which amplitude limitation was performed are inputted to the nonlinear distortion compensation operation unit 4. The nonlinear distortion compensation operation unit 4 refers to distortion compensation coefficients K and θ corresponding to electric power P' of quadrature baseband signals I' and Q'. For example, taking values of I' and Q' as an address, reads distortion compensation coefficients K and θ from the distortion compensation coefficient data memory 7. And the nonlinear distortion compensation operation unit 4 performs distortion compensation operation by complex multiplication based on distortion compensation coefficients K and θ read out to baseband signals I' and Q', and outputs them to an analog signal processing unit. An analog signal processing unit is, for example, a circuit including the DACs 22A and 22B, the quadrature modulator 23 and the power amplifier 25 in FIG. 5.

Part of the output of a power amplifier included in an analog signal processing unit is converted into a digital signal, and fed back to the distortion compensation coefficient calculation unit 6 as feedback quadrature baseband signals Ib and Qb. The distortion compensation coefficient calculation unit 6 compares feedback quadrature baseband signals Ib and Qb and quadrature baseband input signals I' and Q' on the polar coordinates and calculates an amplitude difference and a phase difference. Then the distortion compensation coefficient calculation unit 6 calculates distortion compensation coefficients K and θ based on the amplitude difference and the phase difference, and updates a value of the distortion compensation coefficient data memory 7 by correlating it to electric power P' computed in electric power computation unit 8. The nonlinear distortion compensation operation unit 4 performs adaptive distortion compensation by performing distortion compensation based on the updated distortion compensation coefficient.

The compensation upper limit input electric power calculation unit 11 calculates input electric power Plim such that electric power of quadrature baseband signals I" and Q" after distortion compensation operation becomes nearly equal to upper limit electric power after compensation Pmax set by the limit value setting unit 10 in advance. Upper limit electric power after compensation Pmax is, for example, smallest input level with which a power amplifier becomes saturated. This processing is, if amplitude compensation coefficient K for input electric power Plim is α, processing to calculate Plim for which the formula $$P\text{max}=\alpha \times P\text{lim}$$

holds. When a signal with input electric power exceeding input electric power Plim is inputted to a power amplifier after distortion compensation operation was performed, clipping distortion occurs in a saturation region of the power amplifier. Therefore, perfect distortion compensation cannot be performed. Accordingly, by employing input electric power Plim as a value of the distortion compensable upper limit of input electric power to the power amplifier, occurrence of the clipping distortion can be prevented.

By the processing mentioned above, upper limit input electric power Plim which gives upper limit electric power Pmax of quadrature baseband signals I" and Q" after distortion compensation operation is obtained according to the characteristics of a power amplifier. Also, when an input signal is limited to no more than upper limit input electric power Plim, clipping distortion of a power amplifier can be suppressed.

Accordingly, in the input electric power limit value decision unit 9, by using distortion compensable upper limit input electric power Plim obtained by the compensation upper limit input electric power calculation unit 11, and following the conditions below, electric power limit value Pth which gives the amplitude limitation maximum value of a quadrature baseband signal is decided.

i) If Plim=Pth, leave electric power limit value Pth as it is.
ii) If Plim<Pth, change electric power limit value Pth to upper limit input electric power Plim.
iii) If Plim>Pth, change electric power limit value Pth to upper limit input electric power Plim.

The details and effects of the operation in each case mentioned above are as follows. In case of i), because distortion compensable upper limit input electric power Plim and electric power limit value Pth are equal, it is judged that control is done as expected, and no change of electric power limit value Pth is performed.

In case of ii), distortion compensable upper limit input electric power Plim is smaller than electric power limit value Pth. This means that characteristics of a power amplifier fluctuated and that input level which gives saturated output level of a power amplifier, that is, distortion compensable upper limit input electric power Plim declined. In other words, there is a possibility that linearity of the power amplifier is degraded. Therefore, it is necessary to lower electric power limit value Pth to distortion compensable upper limit input electric power Plim. That is, input amplitude maximum needs to be made small. By making electric power limit value Pth small, it is possible to prevent large signal amplitude from being inputted to the power amplifier, and to suppress clipping distortion.

In case of iii), distortion compensable upper limit input electric power Plim is larger than electric power limit value Pth. This means the characteristics of power amplifier fluctuated, and input level which gives saturated output level of a power amplifier, that is, distortion compensable upper limit input electric power Plim has risen, is meant. In other words, there is a possibility that linearity of the power amplifier is improved. Therefore, it is possible to raise electric power limit value Pth to distortion compensable upper limit input electric power Plim. That is, input amplitude can be made large. By making electric power limit value Pth large, it is possible, while suppressing degradation of EVM (Error Vector Magnitude), to utilize characteristics of a power amplifier to its maximum.

The input electric power limit value decision unit 9 outputs electric power limit value Pth which was obtained as above to the coefficient calculation unit 2. At this time, by obtaining several electric power limit value Pth, their average may be taken and outputted to the coefficient calculation unit 2. That is, the input electric power limit value decision unit 9 may calculate reasonable number of electric power limit value Pth chronologically, store them, take average Pth (ave) of multiple calculated Pth, and output it to the coefficient calculation unit 2.

As described above, in a distortion compensation circuit of the third exemplary embodiment of the present invention, determination is made whether to perform amplitude limitation based on electric power limit value Pth. Power limit value Pth is decided according to the characteristics of a power amplifier. Accordingly, amplitude limitation of a quadrature baseband transmission signal can be performed adaptively, and distortion compensation effects can be improved.

Also, using together a technology which applies limitation to signal amplitude after distortion compensation or to a distortion compensation coefficient itself, for example, the technology described in patent document 1, is unnecessary. Accordingly, it becomes possible to calculate a highly precise distortion compensation coefficient.

(The Fourth Exemplary Embodiment)

Figure 4:
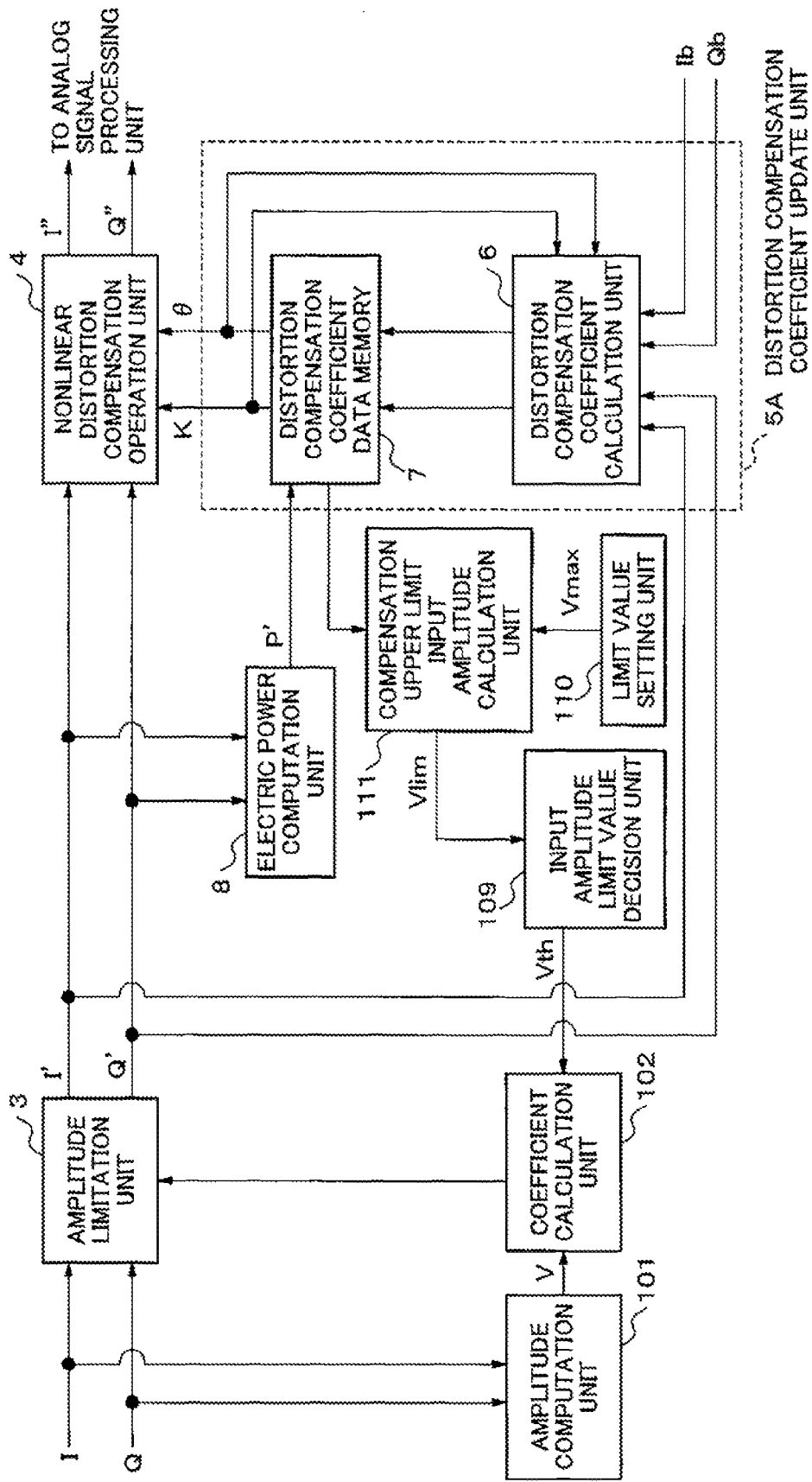
FIG. 4 is a block diagram showing a structure of a distortion compensation circuit of the fourth exemplary embodiment of the present invention.

Next, a distortion compensation circuit of the fourth exemplary embodiment of the present invention will be described with reference to drawings. According to the third embodiment of the present invention, judgment of whether to perform amplitude limitation is made based on electric power limit value Pth. According to the fourth exemplary embodiment of the present invention, judgment of whether to perform amplitude limitation is made based on an amplitude limit value. FIG. 4 is a block diagram showing a structure of a distortion compensation circuit of the fourth exemplary embodiment of the present invention. For those components in FIG. 4 equal to those in FIG. 3, an identical code is attached.

As shown in FIG. 4, a distortion compensation circuit of the fourth exemplary embodiment is that which replaced electric power computation unit 1, coefficient calculation unit 2, input electric power limit value decision unit 9, limit value setting unit 10 and compensation upper limit input electric power calculation unit 11 of FIG. 3 by amplitude computation unit 101, coefficient calculation unit 102, input amplitude limit value decision unit 109, limit value setting unit 110 and compensation upper limit input amplitude calculation unit 111.

The amplitude computation unit 101 computes amplitude V of quadrature baseband signals I and Q and outputs it to coefficient calculation unit 102. Amplitude V is proportional to a square root of electric power P. Accordingly, amplitude V here is obtained by ignoring a unit, and using the formula $$V=(I^2+Q^2)^{1/2}.$$

The coefficient calculation unit 102 compares V from the amplitude computation unit 101 and amplitude limit value Vth given from the input amplitude limit value decision unit 109. In case amplitude V is no more than amplitude limit value Vth, the coefficient calculation unit 102 decides not to perform amplitude limitation and outputs 1 as a multiplier coefficient in order not to limit amplitude of quadrature baseband signals I and Q. On the other hand, in case amplitude V is larger than amplitude limit value Vth, the coefficient calculation unit 102 decides to perform amplitude limitation and outputs Vth/V as a multiplier coefficient. Further, a multiplier coefficient when amplitude limitation is performed is not limited to this value, and any value such that amplitude V of quadrature baseband signals I and Q becomes not more than amplitude limit value Vth will do.

The input amplitude limit value decision unit 109 decides, by using distortion compensable upper limit input amplitude Vlim computed by the compensation upper limit input amplitude calculation unit 111, and following the conditions below, amplitude limit value Vth which gives an amplitude limitation maximum value of a quadrature baseband signal.

i) If Vlim=Vth, leave amplitude limit value Vth as it is.

ii) If Vlim<Vth, change amplitude limit value Vth to upper limit input amplitude Vlim.

iii) If Vlim>Vth, change amplitude limit value Vth to upper limit input amplitude Vlim.

The input amplitude limit value decision unit 109 outputs decided amplitude limit value Vth to the coefficient calculation unit 102. Also, by obtaining several amplitude limit value Vth, their average may be taken and outputted to the coefficient calculation unit 102. That is, the input amplitude limit value decision unit 109 may calculate reasonable number of amplitude limit value Vth chronologically, store them, take the average Vth (ave) of the multiple calculated Vth, and output it to the coefficient calculation unit 102.

Upper limit amplitude Vmax fixed in advance is set in the limit value setting unit 110. It is desirable that a value of upper limit amplitude Vmax is set to input amplitude which makes output of a power amplifier saturated, that is, a square root of saturated input level in order to utilize the performance of the power amplifier to its maximum. Further, upper limit amplitude Vmax is not necessarily set to a square root of saturated input level, and may be set to a value smaller than the square root.

The compensation upper limit input amplitude calculation unit 111 refers to the distortion compensation coefficient data memory 7, and calculates input amplitude Vlim such that amplitude (square root of electric power of a quadrature baseband signal) of a quadrature baseband signal after distortion compensation operation becomes upper limit amplitude Vmax which is set by the limit value setting unit 110. In other words, if amplitude compensation coefficient K for input electric power expressed as a square of input amplitude Vlim is α, then, the compensation upper limit input amplitude calculation unit 111 calculates amplitude Vlim such that the formula $$V\mathrm{max}^2 = \alpha \times V\mathrm{lim}^2$$

holds. Amplitude Vlim is distortion compensable upper limit input amplitude. Because the distortion compensation coefficient data memory 7 stores a distortion compensation coefficient by correlating it to input electric power, α×Vlim² can be obtained easily. Accordingly, input amplitude $Vlim^2$ such that $\alpha \times Vlim^2$ becomes equal to $Vmax^2$ can be obtained easily.

Operation of each of other components of FIG. 4 is similar to each corresponding component of FIG. 3. Further, in FIG. 4, amplitude proportional to a square root of electric power P' may be used instead of electric power P' of quadrature baseband signals I' and Q'. In this case, the distortion compensation coefficient data memory 7 stores distortion compensation coefficients K and θ by correlating them to amplitude.

As described above, in a distortion compensation circuit of the fourth exemplary embodiment of the present invention, determination is made whether to perform amplitude limitation based on amplitude limit value Vth. Amplitude limit value Vth is decided according to the characteristics of a power amplifier. Accordingly, amplitude limitation of a quadrature baseband transmission signal can be performed adaptively, and distortion compensation effects can be improved.

Also, using together a technology which applies limitation to signal amplitude after distortion compensation or to a distortion compensation coefficient itself, for example, the technology described in patent document 1, is unnecessary. Accordingly, it becomes possible to calculate a highly precise distortion compensation coefficient.

As above, first to fourth exemplary embodiments of the present invention were explained in detail using drawings. An actual structure of the present invention is not limited to the first exemplary embodiment, and an exemplary embodiment to which design change was made to the extent that does not deviate from the scope of the present invention is also included in the present invention. Also, first to fourth exemplary embodiments can be combined each other.

(Fifth and Sixth Exemplary Embodiment)

A distortion compensation circuit of the fifth exemplary embodiment of the present invention is a distortion compensation circuit for compensating distortion which occurs in an amplifier for amplifying a quadrature baseband transmission signal and includes the following components. That is, it includes: a coefficient calculation means which determines whether to perform amplitude limitation of a quadrature baseband transmission signal by comparing electric power of a quadrature baseband transmission signal and an inputted limit value, and when determined to perform amplitude limitation, outputs a coefficient for making electric power of a quadrature baseband transmission signal not more than an inputted limit value as a multiplier coefficient; an amplitude limitation means which performs amplitude limitation by multiplying the multiplier coefficient to a quadrature baseband transmission signal; a distortion compensation coefficient calculation means which calculates a phase compensation coefficient by performing an operation to obtain a difference between an output signal of the amplitude limitation means and a feedback signal which fed back part of output signals of an amplifier; a storage means which stores the phase compensation coefficient by correlating it with electric power or amplitude of an output signal of the amplitude limitation means; a distortion compensation operation means which performs distortion compensation to an output signal of the amplitude limitation means based on the phase compensation coefficient, and a limit value calculation means which, by referring to stored contents of the storage means, calculates electric power of an output signal of the amplitude limitation means before distortion compensation operation when electric power of an output signal of the amplitude limitation means after distortion compensation operation by the distortion compensation operation means becomes nearly equal to a predetermined limit value, as an inputted limit value.

A distortion compensation method of the sixth exemplary embodiment of the present invention is a distortion compensation method of a distortion compensation circuit for compensating distortion which occurs in an amplifier for amplifying a quadrature baseband transmission signal and includes the following steps. That is, it includes: a coefficient calculation step which determines whether to perform amplitude limitation of a quadrature baseband transmission signal by comparing electric power of a quadrature baseband transmission signal and an inputted limit value, and when determined to perform amplitude limitation, outputs a coefficient for making electric power of a quadrature baseband transmission signal not more than an inputted limit value as a multiplier coefficient; an amplitude limitation step which performs amplitude limitation by multiplying the multiplier coefficient to a quadrature baseband transmission signal; a distortion compensation coefficient calculation step which calculates a phase compensation coefficient by performing an operation to obtain a difference between a quadrature baseband transmission signal after amplitude limitation and a feedback signal which fed back part of output signals of an amplifier; a distortion compensation operation step which performs distortion compensation to a quadrature baseband transmission signal after amplitude limitation based on the phase compensation coefficient, and a limit value calculation step which, by referring to stored contents of a storage means which stores the phase compensation coefficient by correlating it to electric power or amplitude of a quadrature baseband transmission signal after amplitude limitation, calculates electric power of the signal concerned before distortion compensation operation when electric power of a quadrature baseband transmission signal after distortion compensation operation by distortion compensation operation means becomes nearly equal to a predetermined limit value, as an inputted limit value.

According to the fifth and the sixth exemplary embodiment of the present invention, effects are obtained to improve distortion compensation effect by performing amplitude limitation of a quadrature baseband transmission signal adaptively.

Although the present invention has been described with reference to an exemplary embodiment above, the present invention is not limited to the above-mentioned exemplary embodiment. Various changes which a person skilled in the art can understand can be performed in the structure of the present invention or details to the extent that does not deviate from the scope of the present invention.

The invention claimed is:

1. A distortion compensation circuit comprising:
an input level limitation unit that limits signal level of an input signal from outside to no more than a first limit value, and outputs a signal before distortion compensation;
a distortion compensation unit that performs distortion compensation processing to said signal before distortion compensation based on a distortion compensation coefficient, and outputs a signal after said distortion compensation;
a distortion compensation coefficient calculation unit that calculates a coefficient for compensating distortion of an output signal of an amplifier as a distortion compensation coefficient based on a difference between part of output signals of said amplifier which amplified said signal after distortion compensation and said signal before distortion compensation;

a storage unit that stores said distortion compensation coefficient by correlating it to signal level of said signal before said distortion compensation, and a limit value calculation unit that calculates signal level of said signal before distortion compensation as said first limit value providing the signal level, after said distortion compensation processing based on said distortion compensation coefficient stored in said storage unit is no more than a second limit value which is a limit value of signal level of an input signal to said amplifier.

2. The distortion compensation circuit according to claim 1 wherein said distortion compensation unit performs said distortion compensation processing based on said distortion compensation coefficient corresponding to signal level of said signal before distortion compensation.

3. The distortion compensation circuit according to claim 2, wherein
said storage unit stores said distortion compensation coefficient by correlating it to electric power of said signal before distortion compensation, and
said distortion compensation unit performs said distortion compensation processing based on said distortion compensation coefficient corresponding to electric power of said signal before distortion compensation.

4. The distortion compensation circuit according to claim 2, wherein
said storage unit stores said distortion compensation coefficient by correlating it to amplitude of said signal before distortion compensation, and
said distortion compensation unit performs distortion compensation processing based on said distortion compensation coefficient corresponding to amplitude of said signal before distortion compensation.

5. The distortion compensation circuit according to claim 1, wherein
said second limit value is a limit value which limits electric power of an input signal to said amplifier, and
said limit value calculation unit calculates electric power of said signal before distortion compensation as said first limit value providing the electric power after said distortion compensation processing based on said distortion compensation coefficient stored in said storage unit is no more than said second limit value.

6. The distortion compensation circuit according to claim 1, wherein
said second limit value is a limit value which limits amplitude of an input signal to said amplifier, and
said limit value calculation unit calculates amplitude of said signal before distortion compensation as said first limit value providing the amplitude after said distortion compensation processing based on said distortion compensation coefficient stored in said storage unit is no more than said second limit value.

7. The distortion compensation circuit according to claim 1, said input level limitation unit comprising:
a coefficient calculation unit that calculates an input level limitation coefficient which limits signal level of said signal before distortion compensation to be no more than said first limit value by multiplying it to said input signal, and
multiplying said input level limitation coefficient to said input signal.

8. The distortion compensation circuit according to claim 7, wherein said coefficient calculation unit judges whether to limit signal level of said input signal by comparing signal level of said input signal and said first limit value, and calculates said input level limitation coefficient based on a result of said judgment.

9. The distortion compensation circuit according to claim 1, said input level limitation unit comprising:
a coefficient calculation unit that generates a window function which limits signal level of said signal before distortion compensation to be no more than said first limit value by
multiplying it to said input signal, and multiplying said window function to said input signal.

10. The distortion compensation circuit according to claim 9, wherein said coefficient calculation unit judges whether to limit signal level of said input signal by comparing signal level of said input signal and said first limit value, and generates said window function based on a result of said judgment.

11. The distortion compensation circuit according to claim 7, wherein
said first limit value is a limit value which limits electric power of said input signal, and
said coefficient calculation unit that compares electric power of said input signal and said first limit value, and judges whether to limit signal level of said input signal.

12. The distortion compensation circuit according to claim 7, wherein
said first limit value is a limit value which limits amplitude of said input signal, and
said coefficient calculation unit compares amplitude of said input signal and said first limit value, and judges whether to limit signal level of said input signal.

13. The distortion compensation circuit according to claim 1, wherein said second limit value is saturated input signal level which makes an output of said amplifier saturated.

14. The distortion compensation circuit according to claim 13, wherein said second limit value is saturated input electric power which makes an output of said amplifier saturated.

15. The distortion compensation circuit according to claim 13, wherein said second limit value is saturated input amplitude which makes an output of said amplifier saturated.

16. The distortion compensation circuit according to claim 13, wherein said second limit value is a square root of saturated input electric power which makes an output of said amplifier saturated.

17. The distortion compensation circuit according to claim 1, wherein said distortion compensation coefficient calculation unit calculates said distortion compensation coefficient so that a difference between part of output signals of said amplifier and said signal before distortion compensation becomes minimum.

18. The distortion compensation circuit according to claim 1, wherein said distortion compensation coefficient includes an amplitude compensation coefficient which compensates amplitude and a phase compensation coefficient which compensates phase of an output signal of said amplifier.

19. A distortion compensation circuit comprising:
a coefficient calculation unit that judges whether to limit signal level of a transmission signal by comparing signal level of said transmission signal inputted from outside and a first limit value, and when decided to limit signal level of said transmission signal, outputs a coefficient which limits signal level of said transmission signal to no more than the first limit value;
a signal level limitation unit that limits signal level of said transmission signal by multiplying said coefficient to said transmission signal;

a distortion compensation coefficient calculation unit that obtains a difference between a signal before compensation which is an output signal of said signal level limitation unit and a feedback signal which fed back part of output signals of an amplifier which amplified a signal after distortion compensation which is a signal such that distortion compensation processing is performed to a signal before compensation, and calculates an amplitude compensation coefficient and a phase compensation coefficient;

a storage unit that stores said amplitude compensation coefficient and said phase compensation coefficient by correlating them to electric power or amplitude of said signal before compensation;

a distortion compensation operation unit that performs said distortion compensation processing to said signal before compensation based on said amplitude compensation coefficient and a phase compensation coefficient, and outputs said signal after distortion compensation, and a limit value calculation unit that calculates signal level of said signal before distortion compensation as said first limit value providing the signal level after said distortion compensation processing based on said amplitude compensation coefficient and said phase compensation coefficient stored in said storage unit is no more than a second limit value which is a limit value of signal level of an input signal to an amplifier.

20. A distortion compensation method comprising:

limiting signal level of an input signal from outside to no more than a first limit value, and outputting a signal before distortion compensation;

based on a distortion compensation coefficient, performing distortion compensation processing to said signal before distortion compensation, and outputting a signal after distortion compensation;

based on a difference between part of output signals of an amplifier which amplified said signal after distortion compensation and said signal before distortion compensation, calculating a coefficient for compensating distortion of an output signal of said amplifier as said distortion compensation coefficient;

storing said distortion compensation coefficient by correlating it to signal level of said signal before distortion compensation, and calculating signal level of said signal before distortion compensation as said first limit value providing the signal level after said distortion compensation processing based on said distortion compensation coefficient stored in a storage unit is no more than a second limit value which is a limit value of signal level of an input signal to said amplifier.

* * * * *